United States Patent [19]

Gardiner

[11] Patent Number: 5,020,100
[45] Date of Patent: May 28, 1991

[54] TELEPHONE LINE LOOP CURRENT REGULATOR

[75] Inventor: William H. Gardiner, Cirencester, England

[73] Assignee: U.S. Philips Corporation, New York, N.Y.

[21] Appl. No.: 377,369

[22] Filed: Jul. 7, 1989

[30] Foreign Application Priority Data

Jul. 13, 1988 [GB] United Kingdom ............... 8816634

[51] Int. Cl.$^5$ .............................................. H04M 1/00
[52] U.S. Cl. .................................... 379/379; 379/377; 379/380
[58] Field of Search ............... 379/379, 413, 399, 377, 379/380, 382, 352

[56] References Cited

U.S. PATENT DOCUMENTS

| 4,190,745 | 2/1980 | Jusinskas, Jr. et al. | 379/379 X |
| 4,230,912 | 10/1980 | Lee et al. | 379/379 X |
| 4,535,202 | 8/1985 | Meunier | 379/379 |

FOREIGN PATENT DOCUMENTS 2453094 5/1975 Fed. Rep. of Germany ...... 379/379

Primary Examiner—Jin F. Ng
Assistant Examiner—Jhancy Augustus
Attorney, Agent, or Firm—Bernard Franzblau

[57] ABSTRACT

A telephone line loop current regulator combines the functions of current regulation, current detection, loop disconnect signalling and speech switching. It comprises a gyrator circuit formed by resistor (R1), capacitor (C1), transistor (T1) and resistor (R3). Loop current is regulated by transistor (T1) and resistor (R3) while loop current detection is achieved by monitoring the voltage across resistor (R3) by an opto-diode which forms part of an opto-electronic coupler (OP2). Speech switching is performed by transistor (T3) which also monitors the voltage across resistor (R3) so that speech is switched onto the line via transformer (TR1) when d.c. loop current is present. Line seizure and loop disconnect signalling are carried out by switching the opto-coupler (OP1) to turn the transistor (T1) on and off.

28 Claims, 1 Drawing Sheet

TELEPHONE LINE LOOP CURRENT REGULATOR

BACKGROUND OF THE INVENTION

This invention relates to a telephone line d.c. loop current regulator.

When private switching systems are connected to a public telephone exchange it is necessary for them to regulate the current on the line between the private switching system and the public exchange. The d.c. current regulation has to be performed in the presence of ac signals such as speech. Electronic circuits which terminate analogue telephone lines should behave like standard telephone terminals as seen from the public exchange. One of the requirements is to have a dc current flow to indicate that the terminal is off hook, that is that the terminal wishes to make a telephone call. The dc current should follow voltage/current characteristics which are specified by the network provider. Voice band ac signals should not be affected by the d.c. current regulating circuit. The terminating equipment needs an indication that a current above a threshold level is present. Loop current regulating and detection circuits are usually implemented using inductors in the form of coils to provide the required high ac impedance. At voice band frequencies these coils are relatively large and expensive.

SUMMARY OF THE INVENTION

It is an object of the invention to enable the provision of a loop current regulating circuit in which the use of large and relatively expensive inductors is not required.

The invention provides a telephone line d.c. loop current regulator comprising a gyrator circuit connected across the line, a field effect transistor connected in series with a resistor across the line, the field effect transistor forming the amplifying means of the gyrator circuit, means for regulating the d.c. current through the field effect transistor, and loop current detection means connected across the resistor.

A loop current regulator according to the invention makes it possible to dispense with the use of inductors by forming a gyrator circuit which requires the provision of a capacitor rather than an inductor. The gain producing element of the gyrator comprises the field effect transistor which is connected in series with the resistor across the line and serves also to provide the regulated d.c. loop current.

The loop current detection means may comprise an opto electronic coupling device, the optical emitter being connected in parallel with the resistor. This enables electrical isolation between the telephone line and the loop current detector which indicates that the exchange line has been seized. It is necessary that the line be totally isolated electrically from any equipment ground potentials.

The current regulator may further comprise an electronic switch in the gate circuit of the field effect transistor which is effective when closed to turn on the field effect transistor to cause the exchange line to be seized. The electronic switch may be in the form of an opto-electronic coupling device to preserve electrical isolation between the telephone line and the private switching system.

The electronic switch may also be used to perform loop disconnect signalling to the exchange.

A further switch may be provided which is operative to switch a speech signal onto the line when loop current is established. The further switch may comprise a second further transistor whose control electrode is coupled to the source electrode of the field effect transistor.

In this way the circuit can perform loop current regulation and detection and also loop disconnect signalling and speech switching using a small number of components and without using bulky coils.

BRIEF DESCRIPTION OF THE DRAWINGS

Embodiments of the invention will now be described, by way of example, with reference to the accompanying drawings, in which.

DESCRIPTION OF THE PREFERRED EMBODIMENTS

Figure 1:
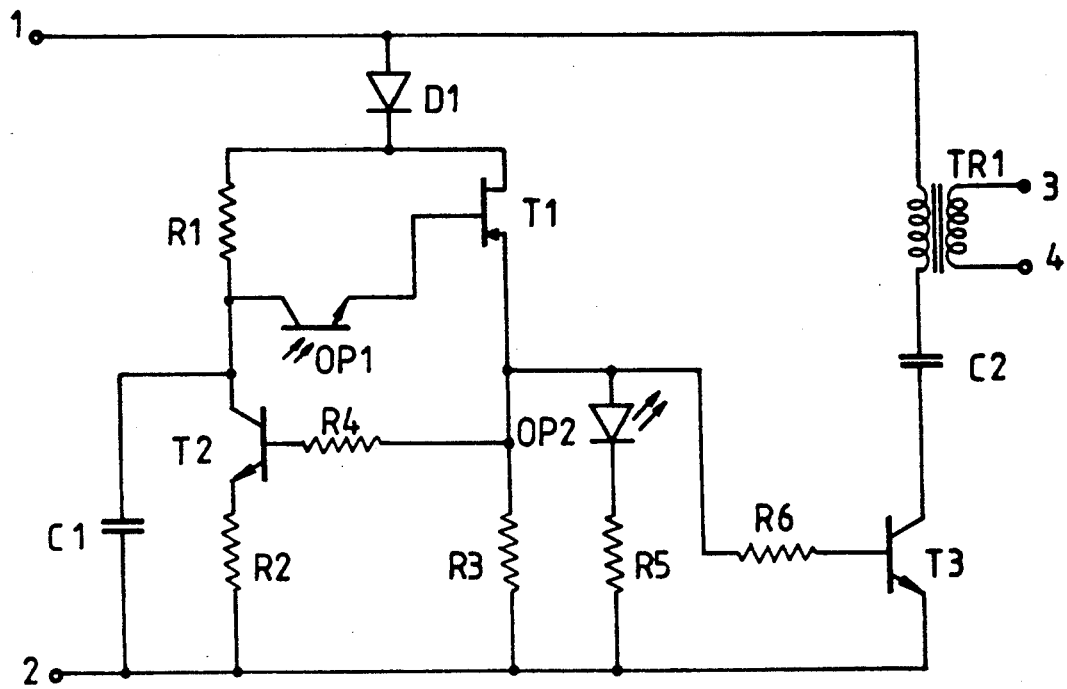
FIG. 1 shows a first embodiment of a telephone line d.c. loop current regulator according to the invention.

FIG. 1 shows a first input terminal 1 which is connected via a diode D1 to the junction of a resistor R1 and the drain electrode of a field effect transistor T1. The other end of the resistor R1 is connected via a capacitor C1 to a terminal 2. The terminals 1 and 2 are arranged for connection to the a and b wires of a telephone line. The junction of the capacitor C1 and resistor R1 is connected to the collector electrode of a npn transistor T2 whose emitter is connected via a resistor R2 to the terminal 2. The source electrode of transistor T1 is connected via a resistor R3 to the terminal 2 and via a resistor R4 to the base electrode of transistor T2. The output switching stage of an opto electronic coupler OP1 is connected between the junction of the resistor R1 and capacitor C1 and the gate electrode of transistor T1. The source electrode of transistor T1 is further connected via the input stage of an opto-electronic coupler OP2 and a resistor R5 to the terminal 2 and via a resistor R6 to the base electrode of a further npn transistor T3. The emitter of transistor T3 is connected to the terminal 2 while its collector is connected to one end of a capacitor C2 whose other end is connected to the secondary winding of a transformer TR1, the other end of which is connected to the terminal 1. The primary winding of transformer TR1 is connected to two terminals 3 and 4.

In operation, when it is desired to seize an exchange line the opto-electronic coupler OP1 is operated so that the output stage forms a short circuit. In this state the circuit comprising resistor R1, capacitor C1, transistor T1 and resistor R3 forms a gyrator circuit which has a high impedance to a.c. signals. The transistor T1 and resistor R3 enable a given loop current to flow and if that loop current is above a certain threshold the opto-electronic coupler OP2 will give an indication that the line has been seized. The signals for seizing the line and the use to which the signal indicating that loop current is present is put do not in themselves form a part of the present invention. These signals are generated and used elsewhere in a private switching system and may be generated and used in an entirely conventional manner. However, the circuit shown in FIG. 1 enables the seizure of the line, the regulation of the direct current on the line and the indication of the presence of loop current all to be performed. At the same time when the loop current is present the transistor T3 is switched on and enables the voice signal to be transferred to the line. This voice signal will not disturb the loop current regulation since the circuit presents a high impedance to AC signals. The additional circuitry comprising resistor R2, resistor R4 and transistor T2 are used to shape the d.c. current characteristic to conform to the requirements set out by the network provider. When loop currents above a certain level are present the effective source resistance increases, thus limiting the increase in loop current with loop voltage. When there is no loop current present the transistor T2 is switched off and hence the impedance between the two conductors of the lines is high.

The transistor T1 is also used for the purpose of loop disconnect pulse generation for signalling. The switching system can produce signals which periodically open and close the switch formed by the output stage of the opto-coupler OP1 thus turning the transistor T1 on and off at the impulsing rate. Thus the same portion of circuitry can be used both to seize the line and perform loop disconnect signalling.

Figure 2:
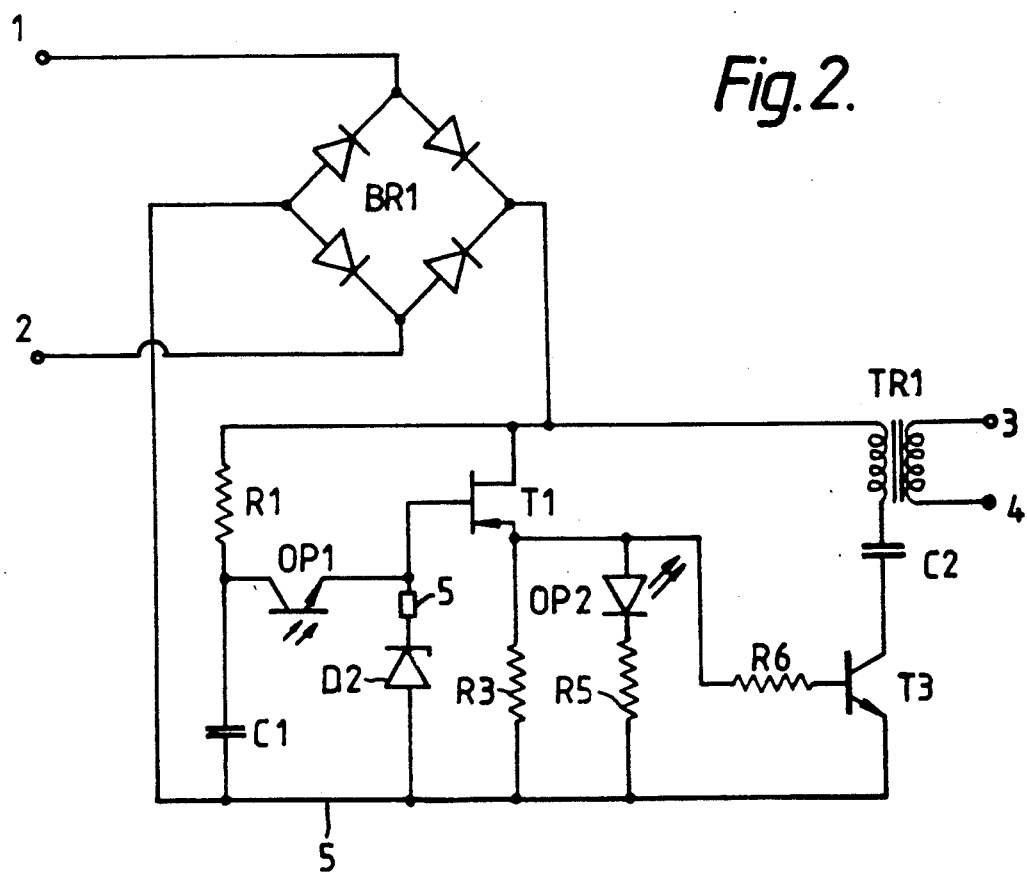
FIG. 2 shows a second embodiment of a telephone line d.c. loop current regulator according to the invention.

The circuit shown in FIG. 2 is similar to that shown in FIG. 1 and corresponding components have been given corresponding reference signs. The differences between FIGS. 1 and 2 are that the potential divider circuit formed by resistors R1 and R2 has been removed and replaced by a voltage reference or zener diode D2 which is connected between the gate electrode of transistor T1 and the line 5 (which is equivalent to the terminal 2 in FIG. 1). The operation of the circuit of FIG. 2 is basically the same as that of the circuit shown in FIG. 1 except that the d.c. current characteristic produced gives a hard current limit above a threshold value. Thus when the voltage across R3 rises above a given value the voltage reference diode D2 breaks down and holds the gate electrode of transistor T1 at a fixed potential. This limits the current through the transistor T1 and prevents the current from increasing thereby producing a hard current limit. A ferrite bead 6 may be provided on the conductor connecting the diode D2 to the gate of transistor T1 to suppress high frequency oscillations and provide greater circuit stability. The provision of a bridge rectifier BR1 instead of the diode D1 enables the polarity of the a and b wires to be in either sense without affecting the operation of the current regulating circuit. Clearly, if the polarity is not important in either the circuit shown in FIG. 1 or the circuit shown in FIG. 2, a bridge rectifier will be used whereas if it is desired that the line should have a given polarity then the diode D1 could be used in the circuit of either FIG. 1 or FIG. 2.

From reading the present disclosure other modifications will be apparent to persons skilled in the art. Such modifications may involve other features which are already known in the design and use of telephone line loop circuits and devices and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation of one or more of those features which would be obvious to persons skilled in the art, whether or not it relates to the same invention as presently claimed in any claim and whether or not it mitigates any or all of the same technical problems as does the present invention.

I claim:

1. A telephone line d.c. loop current regulator comprising: a gyrator circuit connected across the line, a field effect transistor connected in series with a resistor across the line, the field effect transistor forming the amplifying means of the gyrator circuit, means responsive to current flow through the field effect transistor for regulating the d.c. current through the field effect transistor, and loop current detection means connected across the resistor.

2. A current regulator as claimed in claim 1, including a further switch which is operative to switch a speech signal onto the line when loop current is established.

3. A current regulator as claimed in claim 2, wherein the further switch comprises a further transistor whose control electrode is coupled to a source electrode of the field effect transistor.

4. A telephone line d.c. loop current regulator comprising: a gyrator circuit connected across the line, a field effect transistor connected in series with a resistor across the line, the field effect transistor forming the amplifying means of the gyrator circuit, means for regulating the d.c. current through the field effect transistor, loop current detection means connected across the resistor, and an electronic switch in the gate circuit of the field effect transistor which is effective when closed to turn on the field effect transistor to cause the line to be seized.

5. A current regulator as claimed in claim 4, wherein the electronic switch is the output part of an opto-electronic coupler.

6. A current regulator as claimed in claim 4, wherein the electronic switch is controlled so as to cause the field effect transistor to produce loop disconnect signalling pulses on the telephone line.

7. A current regulator as claimed in claim 4, wherein the loop current detection means comprise an opto-electronic coupling device connected in parallel with the resistor.

8. A current regulator as claimed in claim 4 further comprising a voltage reference diode connected between the gate of the field effect transistor and the loop conductor to which the resistor is connected.

9. A current regulator as claimed in claim 8 further comprising oscillation suppression means connected between the voltage reference diode and the gate of the field effect transistor.

10. A current regulator as claimed in claim 4 further comprising, a resistive potential divider connected across the line via a switch, a capacitor connected between the gate of the field effect transistor and the loop conductor connected to the resistor, and means for coupling a point on the potential divider to the gate of the field effect transistor.

11. A current regulator as claimed in claim 10, wherein the potential divider includes a further transistor which is controlled so as to be turned off when the field effect transistor is turned off.

12. A current regulator as claimed in claim 11, wherein a control electrode of the further transistor is coupled to a source electrode of the field effect transistor.

13. A telephone line d.c. loop current regulator comprising: a gyrator circuit connected across the line, a field effect transistor connected in series with a resistor across the line, the field effect transistor forming the amplifying means of the gyrator circuit, means for regulating the d.c. current through the field effect transistor, loop current detection means connected across the resistor, and a voltage reference diode connected between the gate of the field effect transistor and a loop conductor to which the resistor is connected.

14. A current regulator as claimed in claim 13 further comprising oscillation suppression means connected between the voltage reference diode and the gate of the field effect transistor.

15. A current regulator as claimed in claim 14, wherein the oscillation suppression means comprises a ferrite bead surrounding a conductor coupled between the voltage reference diode and the gate of the field effect transistor.

16. A telephone line loop current regulator comprising:
a gyrator circuit which includes a field effect transistor connected in a first series circuit with a first resistor across first and second wires of the telephone line and further comprising a capacitor and a second resistor connected in a second series circuit across said first and second wires of the telephone line,
means coupled to the field effect transistor for regulating DC current through the field effect transistor, and
loop current detection means coupled across the first resistor.

17. A current regulator as claimed in claim 16 wherein the loop current detection means comprises an opto-electronic coupling device having an optical emitter connected in parallel with the first resistor.

18. A current regulator as claimed in claim 16 further comprising, a resistive potential divider connected across the telephone line, said capacitor being connected via a switch between the gate of the field effect transistor and the second wire, and means for coupling a point on the potential divider to the gate of the field effect transistor.

19. A current regulator as claimed in claim 16, wherein said DC current regulating means comprises a further transistor connected in a third series circuit with the second resistor across said first and second wires of the telephone line and with a control electrode of the further transistor connected to said first resistor whereby said further transistor is switched off when loop current is absent thereby producing a high impedance between said first and second wires.

20. A current regulator as claimed in claim 16, further comprising a switching transistor responsive to loop current for switching a speech signal to said first and second wires when a loop current is present.

21. A current regulator as claimed in claim 20, wherein said switching transistor has a base electrode connected to the first resistor so as to monitor the voltage developed across said first resistor thereby to determine the presence of said loop current.

22. A current regulator as claimed in claim 16, further comprising an electronic switch coupled in the gate circuit of the field effect transistor and triggered on and off so as to control in turn on/off conduction in said field effect transistor.

23. A current regulator as claimed in claim 22, wherein said DC current regulating means comprises a further transistor connected in a third series circuit with the second resistor across said first and second wires of the telephone line and with a control electrode of the further transistor connected to said first resistor whereby said further transistor is switched off when loop current is absent thereby producing a high impedance between said first and second wires.

24. A current regulator as claimed in claim 23, wherein said electronic switch is coupled between the gate of the field effect transistor and a junction point between the second resistor and the further transistor.

25. A telephone line d.c. loop current regulator comprising: a gyrator circuit connected across the line, a field effect transistor connected in series with a resistor across the line, the field effect transistor forming the amplifying means of the gyrator circuit, means for regulating the d.c. current through the field effect transistor, loop current detection means connected across the resistor, a resistive potential divider connected across the telephone line, said potential divider including a further transistor which is controlled so as to be turned off when the field effect transistor is turned off, a capacitor connected between the gate of the field effect transistor and a loop conductor which is connected to the resistor, and means for coupling a point on the potential divider to the gate of the field effect transistor.

26. A current regulator as claimed in claim 25, wherein a control electrode of the further transistor is coupled to a source electrode of the field effect transistor.

27. A current regulator as claimed in claim 26 including a further switch which is operative to switch a speech signal onto the line when loop current is established.

28. A current regulator as claimed in claim 27, wherein the further switch comprises a second further transistor whose control electrode is coupled to the source electrode of the field effect transistor.

* * * * *